(12) United States Patent
Fastow

(10) Patent No.: US 6,449,188 B1
(45) Date of Patent: Sep. 10, 2002

(54) LOW COLUMN LEAKAGE NOR FLASH ARRAY-DOUBLE CELL IMPLEMENTATION

(75) Inventor: Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/884,565

(22) Filed: Jun. 19, 2001

(51) Int. Cl.[7] .............................................. G11C 16/00
(52) U.S. Cl. ........................ 365/185.18; 365/185.17; 365/185.33
(58) Field of Search ................. 365/185.18, 185.11, 365/185.17, 185.33, 63, 72

(56) References Cited

U.S. PATENT DOCUMENTS

| | | | |
|---|---|---|---|
| 4,698,787 A | 10/1987 | Mukherjee et al. | 365/104 |
| 5,120,671 A | 6/1992 | Tang et al. | 437/43 |
| 5,191,551 A * | 3/1993 | Inoue | 365/185.17 |
| 5,650,964 A | 7/1997 | Chen et al. | 365/185.25 |
| 5,943,262 A | 8/1999 | Choi | 365/185.17 |
| 5,949,718 A | 9/1999 | Randolph et al. | 365/185.33 |
| 5,989,959 A | 11/1999 | Araki | 438/258 |
| 6,033,955 A | 3/2000 | Kuo et al. | 438/257 |
| 6,067,250 A * | 5/2000 | Ravazzi et al. | 365/185.17 |
| 6,266,274 B1 * | 7/2001 | Pockrandt et al. | 365/185.17 |
| 6,363,014 B1 * | 3/2002 | Fastow | 365/185.18 |

\* cited by examiner

*Primary Examiner*—Tan T. Nguyen
(74) *Attorney, Agent, or Firm*—Eschweiler & Associates, LLC

(57) ABSTRACT

The present invention relates to a flash memory array architecture, comprising a plurality of bit lines, wherein each of the bit lines comprise a plurality of memory cells associated therewith. The plurality of memory cells are configured as sets of two series-connected memory cells, wherein two sets of such memory cells are coupled together in parallel between a respective bit line and an individually selectable source line. In addition, the flash memory array architecture comprises a plurality of word lines, wherein each of the plurality of memory cells associated with one of the plurality of bits lines is coupled to a respective one of the plurality of word lines. The present invention further comprises a method of reading flash memory cells associated with such an architecture.

20 Claims, 11 Drawing Sheets

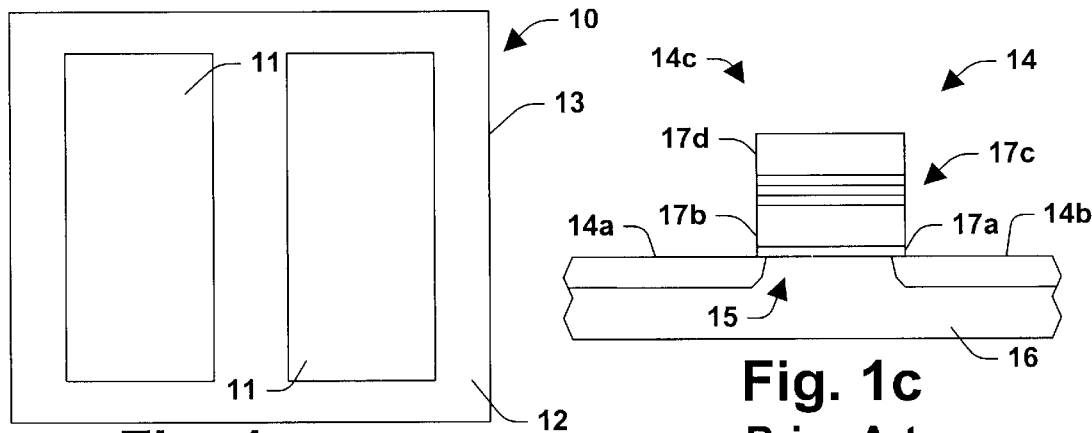
Fig. 1a
Prior Art
Fig. 1c
Prior Art
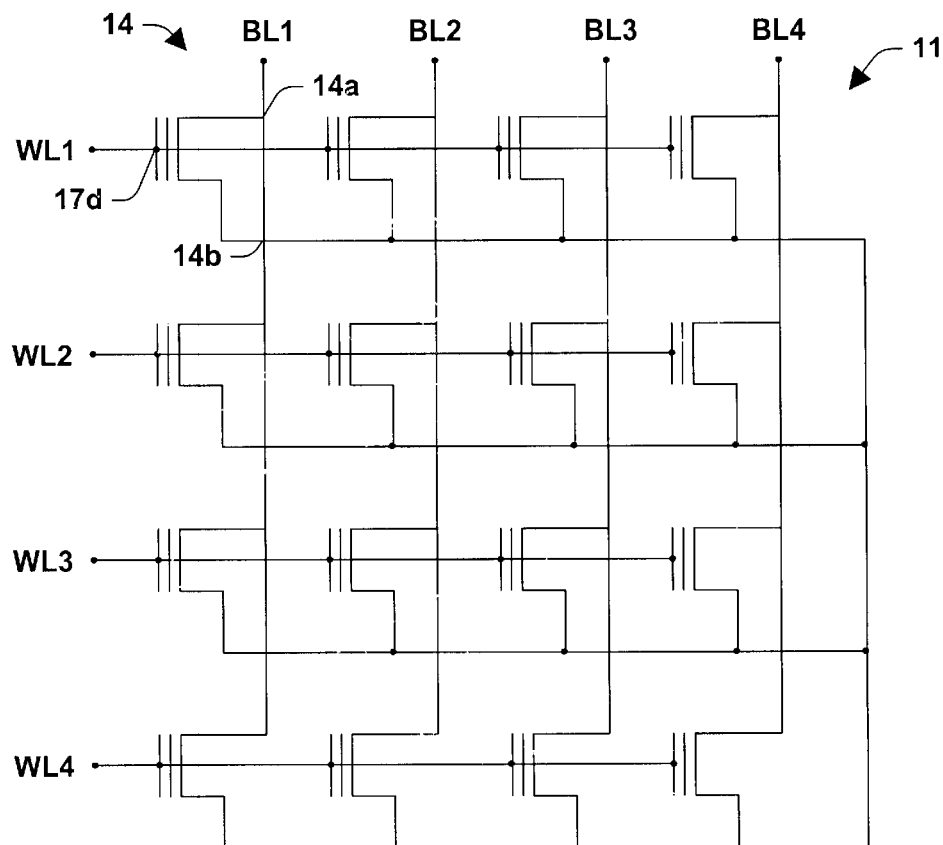
Fig. 1b
Prior Art

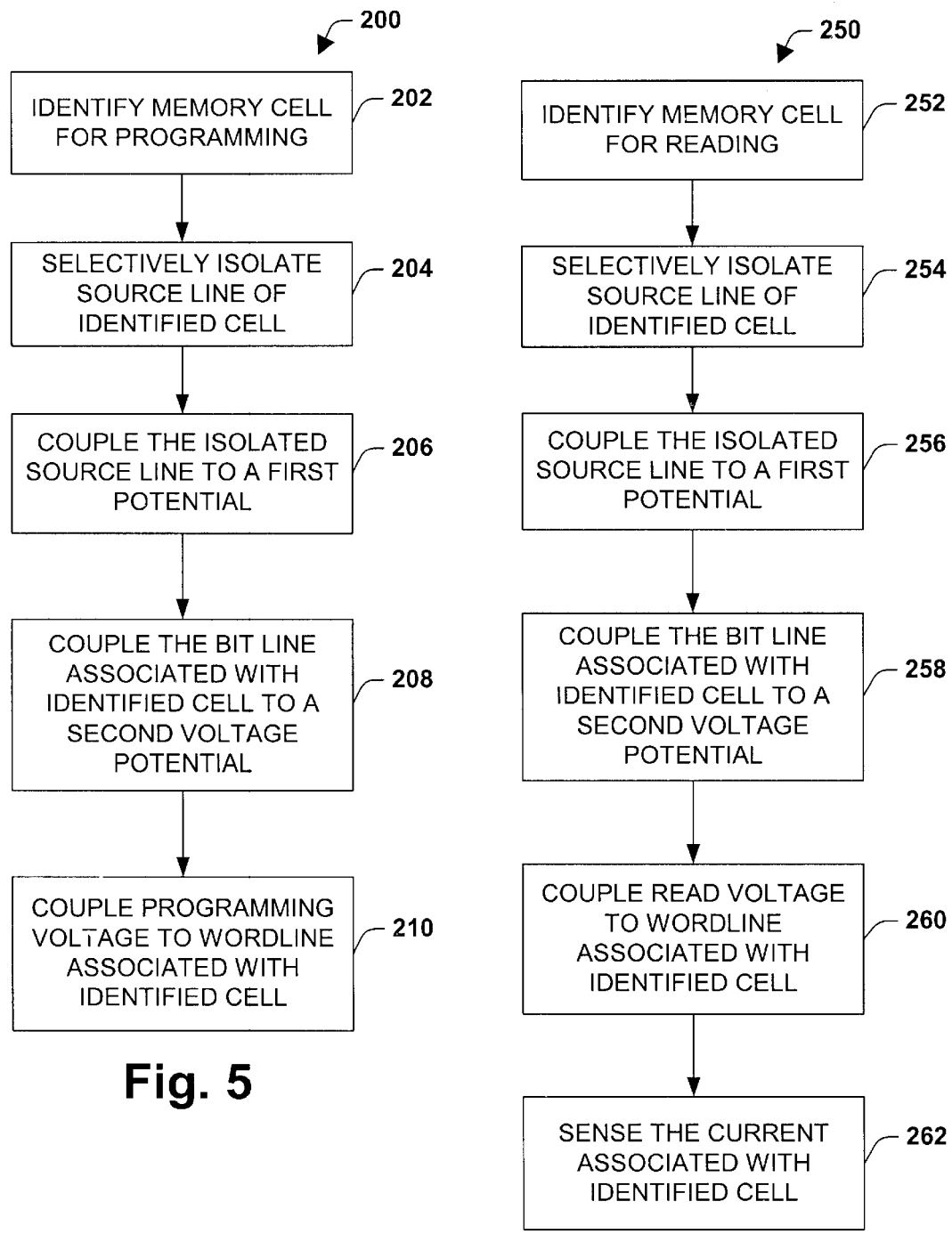

IF $I_{L(CELL\ C)} > I_{L(CELL\ D)}$, THEN $I_{L(TOTAL)} = I_{L(CELL\ D)}$

IF $I_{L(CELL\ C)} < I_{L(CELL\ D)}$, THEN $I_{L(TOTAL)} = I_{L(CELL\ C)}$

US 6,449,188 B1

LOW COLUMN LEAKAGE NOR FLASH ARRAY-DOUBLE CELL IMPLEMENTATION

CROSS REFERENCE TO RELATED APPLICATION

This application is related to U.S. application Ser. No. 09/694,688 filed Oct. 23, 2000, which is entitled "Low Column Leakage Nor Flash Array Single Cell Implementation".

FIELD OF THE INVENTION

The present invention generally relates to floating gate memory devices such as an array of flash memory cells, and relates more particularly to a circuit architecture and method for reading and programming NOR flash arrays to reduce column leakage associated therewith.

BACKGROUND OF THE INVENTION

As is generally known, in recent years a new category of electrically erasable EPROMs/EEPROMs has emerged as an important non-volatile memory which combines the advantages of EPROM density with EEPROM electrical erasability and are sometimes referred to as "flash" EPROM or EEPROM. Flash memory devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NOR-type circuit configuration, such as, for example, the configuration illustrated in prior art FIG. 1b. Each memory cell 14 has a drain 14a, a source 14b and a stacked gate 14c.

The NOR configuration illustrated in FIG. 1b has each drain terminal 14a of the transistors within a single column connected to the same bit line (BL). In addition, each flash cell 14 has its stacked gate terminal 14c coupled to a different word line (WL) while all the flash cells in the array have their source terminals 14b coupled to a common source terminal (CS). In operation, individual flash cells may be individually addressed via the respective bit line and word line using peripheral decoder and control circuitry for programming (writing), reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a, and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, e.g., prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

According to conventional operation, the flash memory cell 14 operates in the following manner. The cell 14 is programmed by applying a relatively high voltage $V_G$ (e.g., approximately 10 volts) to the control gate 17d and connecting the source to ground and the drain 14a to a predetermined potential above the source 14b. These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide into the floating gate 17b and become trapped in the floating gate 17b since the floating gate 17b is surrounded by insulators (the interpoly dielectric 17c and the tunnel oxide 17a). As a result of the trapped electrons, the threshold voltage of the cell 14 increases, for example, by about 2 to 5 volts. This change in the threshold voltage (and thereby the channel conductance) of the cell 14 created by the trapped electrons is what causes the cell to be programmed.

To read the memory cell 14, a predetermined voltage $V_G$ that is greater than the threshold voltage of an unprogrammed or erased cell, but less than the threshold voltage of a programmed cell, is applied to the control gate 17d with a voltage applied between the source 14b and the drain 14a (e.g., tying the source 14b to ground and applying about 1–2 volts to the drain 14a). If the cell 14 conducts (e.g., about 50–100 $\mu$A), then the cell 14 has not been programmed (the cell 14 is therefore at a first logic state, e.g., a zero "0"). Likewise, if the cell 14 does not conduct (e.g., considerably less current than 50–100 $\mu$A), then the cell 14 has been programmed (the cell 14 is therefore at a second logic state, e.g., a one "1"). Consequently, one can read each cell 14 to determine whether it has been programmed (and therefore identify its logic state).

A flash memory cell 14 can be erased in a number of ways. In one arrangement, a relatively high voltage Vs (e.g., approximately 12–20 volts) is applied to the source 14b and the control gate 17d is held at a ground potential ($V_G$=0), while the drain 14a is allowed to float. Under these conditions, a strong electric field is developed across the tunnel oxide 17a between the floating gate 17b and the source 14b. The electrons that are trapped in the floating gate undergo Fowler-Nordheim tunneling through the tunnel oxide 17a to the source 14b. In another arrangement, applying a negative voltage on the order of minus 10 volts to the control gate, applying 5 volts to the source and allowing the drain to float can also erase a cell. In a further arrangement, applying 5 volts to the P-well and minus 10 volts to the control gate while allowing the source and drain to float erases a cell.

When an array of such cells is erased under these conditions, some of the cells will have lower threshold voltages than others. Consequently, even with the control gate 14c being grounded the cell 14 will always be turned on a small amount which causes column leakage current, thereby preventing the proper reading of any other cell in the column of the array containing this cell. In addition, such a condition makes programing of the other cells in the same column increasingly more difficult. This condition often is referred to as "bit over-erase" which is disadvantageous since the data programming characteristics of the memory cell 14 is deteriorated so as to cause endurance failures.

The issue of column leakage is significant because in many arrays 512 flash cells are associated with each bit line (BL). Thus if some or all of the 511 non-selected cells in the bit line are exhibiting leakage, power dissipation increases which is highly disadvantageous in portable applications, for example, in which a battery is used as the power supply. In addition, reading the data associated with the selected cell is more difficult because the current associated with the "leaky" cells is also detected and a determination must then be made whether the detected current reflects a "0" from a conducting selected cell or instead is really a "1" and the detected current simply reflects the cumulative leakage current of the leaky cells.

There is a strong need in the art for a flash memory device structure, architecture and process for manufacture that improves the performance and reliability of the device.

SUMMARY OF THE INVENTION

The present invention relates to a circuit architecture and method of reading data or programming data in a flash memory in which column leakage associated with over-erased bits is greatly reduced.

According to one aspect of the present invention, a NOR flash memory architecture is disclosed in which individually selectable source lines are run generally parallel to the word lines (e.g., horizontally). In addition, two memory cells associated with a given bit line are coupled in parallel between the bit line and a unique individually selectable source line, yet are connected to separate word lines. Consequently, when reading a desired memory cell, column leakage only occurs with respect to the "parallel cell" and the remaining cells associated with the selected bit line do not experience any column leakage. With such an implementation column leakage is reduced by about three (3) or more orders or magnitude over the prior art. Accordingly, power dissipation associated with column leakage current is greatly reduced and the temperature compensation associated with the column leakage is simplified substantially. Furthermore, the architecture of the present invention operates in a manner which is similar to conventional NOR architecture operation, needs only minimal additional logic, and does not require additional metal layers to implement.

According to one aspect of the present invention, a NOR-type flash memory array architecture is disclosed. The flash memory architecture comprises a plurality of flash memory cells which are electrically organized in a column, wherein a drain terminal of each of the flash memory cells are coupled together and for an array bit line input. Further, the control gate terminal associated with each of the flash cells are coupled to a different word line input. In addition, at least one of the flash cells in the array has a source terminal which is electrically isolated from one or more of the source terminals of the other flash cells in the array. Consequently, when the flash cell having the electrically isolated source terminal is selected, for example, to be read, a leakage current associated with flash cells due to a bit over-erase condition is reduced substantially, thereby decreasing power dissipation and increasing cell read accuracy.

According to another aspect of the present invention, a NOR-type flash memory architecture is disclosed which comprises an M×N array of flash memory cells, wherein M represents a number of columns or bit lines, and N represents a number of rows or word lines. In the M×N array, each flash memory cell associated with a given bit line has a drain terminal coupled thereto and each flash memory cell associated with the given bit line has a control gate terminal coupled to a different word line input. Furthermore the flash memory cells along the given bit line are separated into pairs, wherein each pair of cells are coupled together in parallel between the bit line input and an individually selectable source line which is coupled to a source terminal of each flash cell in the pair. The individually selectable source lines allow electrical isolation between one pair of flash cells from the other flash cells associated with the same bit line, thereby reducing substantially column leakage during programming and reading.

In accordance with yet another aspect of the present invention, a method of programming a flash memory cell in a flash memory array is disclosed. The method includes identifying a flash memory cell in the array for programming and individually selecting a source line associated with the identified cell, wherein the selected source line is not associated with all of the flash cells in the flash memory array. The bit line associated with the identified flash memory cell is then coupled to a voltage potential to facilitate programming and a programming voltage is coupled to a word line associated with the identified cell.

In accordance with still another aspect of the present invention, a method of reading a flash memory cell in a flash memory array is disclosed. The method includes identifying a flash memory cell in the array for programming and individually selecting a source line associated with the identified cell, wherein the selected source line is not associated with all of the flash cells in the flash memory array. The bit line associated with the identified flash memory cell is then coupled to a voltage potential to facilitate reading and a read voltage is coupled to a word line associated with the identified cell. The current in the associated bit line is then sensed and used to determine whether or not the identified memory cell has been programmed.

In accordance with another aspect of the present invention, a method of programming a NOR type flash cell is disclosed. During programming, one or more of the unselected bit lines are grounded or set at a voltage which is less that the programming voltage of the selected bit line, as opposed to floating all unselected bit lines as is done in the prior art. By setting a voltage of one or more of the unselected bit lines during programming, the source side resistance of the selected cell is reduced, thus providing a larger drain-to-source voltage and consequently a faster programming speed.

According to yet another aspect of the present invention, a flash memory array architecture is disclosed in which two or more flash memory cells associated with a given bit line are coupled together in series between their respective bit line and an individually selectable source line to form a set. Further, the series-connected flash memory cells are coupled to separate word lines. In addition, set pairs of such series-connected flash memory cells associated with a given bit line are coupled in parallel between the bit line and a unique, individually selectable source line. Consequently, when reading a desired memory cell, column leakage only occurs with respect to the "parallel" set of cells and the remaining cells associated with a given bit line do not experience any column leakage. Further still, due to the "parallel" set of cells that may experience leakage being in series with one another, column leakage is further minimized.

With such an implementation column leakage is reduced by about three (3) or more orders or magnitude over the prior art. Accordingly, power dissipation associated with column leakage current is greatly reduced and the temperature compensation associated with the column leakage is simplified substantially. Furthermore, the architecture of the present invention operates in a manner which is similar to a conventional NOR architecture operation, needs only minimal additional logic, and does not require additional metal layers to implement.

According to another aspect of the present invention, a flash memory array architecture comprises a plurality of bit lines, wherein each of the bit lines comprise a plurality of memory cells associated therewith. The plurality of memory cells associated with a given bit line are configured as sets of two or more series-connected flash memory cells, wherein two sets of such series-connected flash memory cells are coupled together in parallel between a respective bit line and an individually selectable source line. In addition, the flash memory array architecture further comprises a plurality of word lines. Each of the plurality of flash memory cells associated with a bit line is coupled to a respective one of the plurality of word lines.

According to another aspect of the present invention, a first set of series-connected memory cells comprises a first flash memory cell having a drain terminal coupled to the respective bit line, a gate terminal coupled to one of the plurality of word lines, and a source terminal. The set further comprises a second flash memory cell having a drain terminal coupled to the source terminal of the first flash memory cell, a gate terminal coupled to a second one of the plurality of word lines, and a source terminal coupled to the individually selectable source line. When one of the flash memory cells in the set is selected to be read (e.g., the first flash memory cell), a read voltage is applied to the word line associated with the selected cell, and the second flash memory cell has a pass voltage applied to its respective word line, thereby allowing the second flash memory cell to conduct and pass the current associated with the selected flash memory cell for reading.

According to yet another aspect of the present invention, a second set of series-connected flash memory cells, which are coupled in parallel with the first set, have their respective word lines grounded, and the second set of series-connected flash memory cells are the only cells associated with the selected bit line which will contribute to any column leakage. Since the flash memory cells in the second set are connected in series, column leakage associated therewith is further minimized by minimizing leakage to the current associated with the least leaky cell in the set.

According to still another aspect of the present invention, the flash memory array architecture further comprises an address control circuit associated with the array of flash memory cells. The address control circuit is operable to generate a plurality of voltages when a flash memory cell is to be read, and further operable to couple the generated voltages to various portions of the array. For example, the address control circuit is operable to couple a first voltage to the respective bit line and a read voltage to the word line associated with the flash memory cell to be read. In addition, the address control circuit is operable to couple a pass voltage to the word line of the flash memory cell connected in series with the flash memory cell to be read, and couple a second voltage which is less than the first voltage to the word lines of the remaining bit lines and the individually selectable source line associated with the flash memory cell to be read.

In doing so, all sets of flash memory cells associated with a given bit line which are not in parallel with the set of series-connected flash memory cells containing the cell to be read do not contribute to column leakage. Furthermore, the only cells which can possibly contribute to column leakage are coupled in series with one another, thus further minimizing the impact of any such leakage.

In accordance with still another aspect of the present invention, a method of reading such a flash memory array architecture is disclosed. The method includes coupling a bit line associated with a selected flash memory cell to be read to a first voltage (e.g., a supply voltage value). An individually selectable source line associated with the selected flash memory cell is then coupled to a second voltage which is less than the first voltage (e.g., a circuit ground potential). The method further includes coupling a word line associated with the flash memory cell to be read to a read voltage and coupling a word line associated with the flash memory cell which is coupled in series with the selected flash memory cell to be read to a pass voltage in order to allow the current associated with the selected flash memory cell to be detected accurately.

In addition, word lines associated with the parallel set of series-connected flash memory cells (parallel with the set containing the selected flash memory cell) are connected to a third voltage which is less than the first voltage (e.g., a circuit ground potential). Lastly, a current associated with the selected flash memory cell is detected and the current is indicative of a data value associated with the selected flash memory cell.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a is a plan view of a conventional flash memory device illustrating core regions and peripheral regions, respectively;

FIG. 1b is a schematic diagram illustrating a conventional NOR-type flash memory circuit architecture;

FIG. 1c is a cross section diagram illustrating a conventional stacked gate flash memory cell;

FIG. 5 is a flow chart diagram illustrating a method of programming a cell in a NOR-type flash memory circuit architecture in accordance with one aspect of the present invention FIG. 6 is a flow chart diagram illustrating a method of reading a cell in a NOR-type flash memory circuit architecture in accordance with one aspect of the present invention;

DETAILED DESCRIPTION OF THE INVENTION

Figure 2:
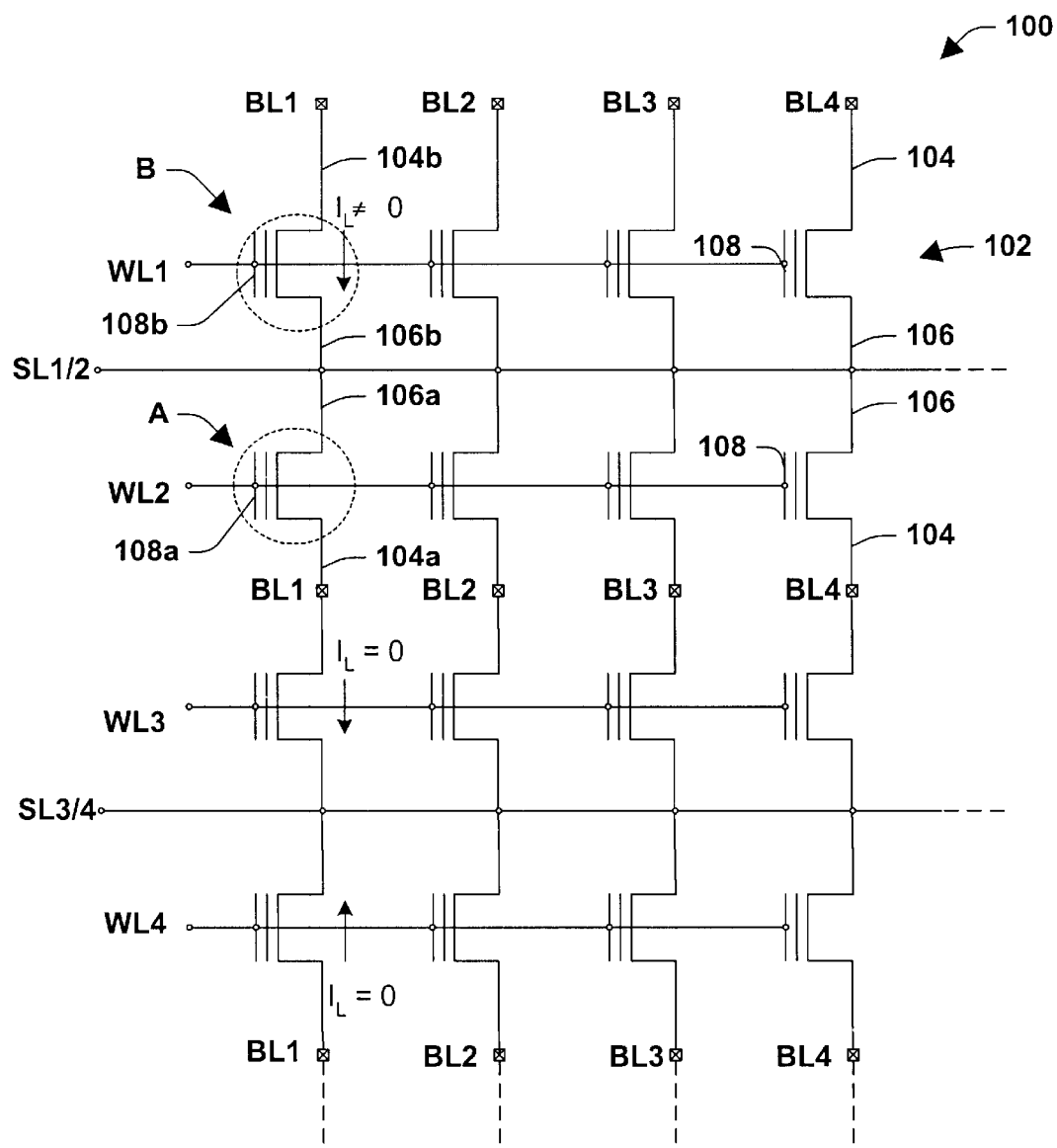
FIG. 2 is a schematic diagram illustrating a NOR-type flash memory circuit architecture in accordance with one aspect of the present invention.

The present invention will now be described with reference to the drawings, wherein like reference numerals are used to refer to like elements throughout.

The present invention provides a circuit architecture and a method of operation associated with a NOR-type flash memory circuit in which horizontal source lines (e.g., generally parallel to the word lines) are employed which may be individually selected during a read or programming (write) step. Consequently, during read or programming, only those flash cells associated with the one selected source line will be available to contribute to potential leakage current. Therefore by minimizing a number of flash cells associated with each individually selectable source line leakage current, for example, caused by bit over-erase conditions, is limited to only those cells associated therewith, as opposed to all the cells of a given bit line as in the prior art. Consequently, power dissipation is decreased and cell read accuracy is simplified and improved.

According to another aspect of the present invention, another flash memory architecture and associated method of reading data in such an architecture is disclosed. The flash architecture comprises sets of series-connected flash cells along a given bit line, wherein set pairs are coupled in parallel with one another between the respective bit line and a unique, individually selectable source line. When a particular cell is identified for a read operation, a read voltage is applied to the word line associated with the identified cell and a pass voltage(s) is applied to those cells which are connected in series with the identified cell within the set.

Further, the set of series-connected cells which is coupled in parallel with the set containing the identified cell has their word lines coupled to ground, along with the associated individually selectable source line, while the remaining source lines are left floated or are coupled to a high impedance state. During read, only those cells in parallel with the identified cell contribute to column leakage, and since they are connected in series, such leakage is minimized by limiting the leakage to the cell in the string which is the least leaky. Such an architecture reduces power consumption and improves read accuracy.

Referring initially to the figures, FIG. 2 is a schematic diagram illustrating a NOR type flash circuit architecture portion 100 according to one exemplary aspect of the present invention. The architecture 100 includes an array (e.g., about 512×512 cells, although only a 4×4 sub-array is illustrated for purposes of simplicity) of bit lines (BL1–BL4) and word lines (WL1–WL4). The various cells 102 consist of a drain terminal 104, a source terminal 106 and a control gate terminal 108, respectively, and are arranged in columns along each respective bit line and in rows along each respective work line such that the various cells may be individually addressed.

In contrast to conventional architectures such as that illustrated in prior art FIG. 1b, each of the source terminals 106 are not connected to a common source line (CS). Instead, a pair of cells (e.g., cells A and B illustrated in FIG. 2) are connected in parallel between a bit line (e.g., BL1) and an individually selectable source line (SL) (e.g., SL1/2) which runs generally parallel (e.g., horizontally) to the word lines. That is, both drain terminals of cells A and B are connected to the same bit line (e.g., BL1) and both source terminals are connected to the individually selectable source line (e.g., SL1/2), while cells A and B have their control gate terminals coupled to different word lines (e.g., WL2 and WL1, respectively). The source lines of architecture 100 are called individually selectable source lines because each source line may be individually addressed via control logic circuitry (not shown) as opposed to the prior art architecture in which all of the source terminals in the entire array are addressed collectively.

The architecture 100 of FIG. 2 operates in a manner which is similar to conventional NOR circuit implementations, however, the individually selectable source line (SL) architecture results in a substantial reduction in column leakage. The reduction in column leakage in the architecture 100 is due to the individually selectable source lines (SL) isolating two cells associated with a given bit line from the other cells associated with the same bit line. How this functionality occurs may best be understood in conjunction with the following example.

Figure 3:
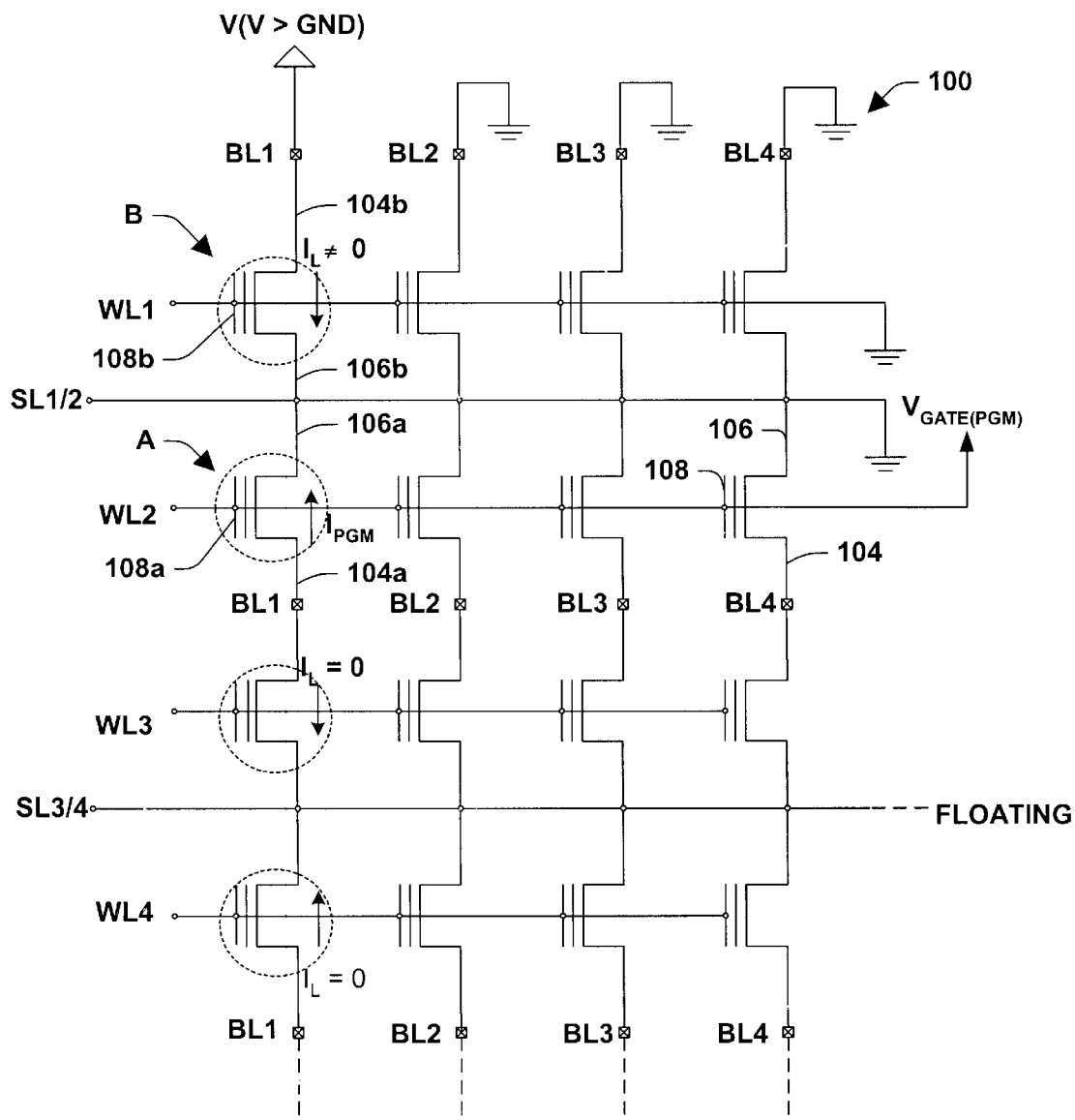
FIG. 3 is a schematic diagram illustrating a programming or write operation with the NOR-type flash memory circuit architecture of FIG. 2 in accordance with one aspect of the present invention.

When programming a particular cell, for example, cell A of FIG. 2, a high voltage ($V_{GATE(PGM)}$) is applied to its word line (WL2) so as to apply the voltage to the control gate 108a of cell A. All the other word lines are grounded. In addition, the individually selectable source line associated with cell A (SL1/2) is connected to ground while the other individually selectable source lines are allowed to float. Lastly, a voltage having a value which is a predetermined amount greater than ground is applied to the bit line associated with cell A (BL1) so as to apply the voltage to the drain of cell A, while the other bit lines are grounded. Such an exemplary circuit condition is illustrated in FIG. 3. These voltages generate a vertical and lateral electric field along the length of the channel from the source to the drain of cell A. This electric field causes electrons to be drawn off the source and begin accelerating toward the drain of cell A, where they are able to jump over the potential barrier of the oxide into the floating gate, causing the threshold voltage of the cell to increase. At the same time, cell B also has a voltage across its drain and source terminals (due to the bit line (BL1) and individually selectable source line (SL1/2) addressing).

Although the control gate of cell B is grounded (WL1), positive charge which may have accumulated within its floating gate due to the over-erase phenomena described supra may cause cell B to experience leakage (e.g., $I_L \neq 0$). However, as illustrated in FIG. 3, cell B is the only cell along its bit line (BL1) which will experience leakage because all the other nonselected cells (e.g., cells C and D) are coupled to separate individually selectable source lines which are not grounded, but rather are floating. Consequently, although the bit line (BL1) has been addressed, because the source terminals of all the other cells associated with BL1 are floating, any positive charge in their floating gates will not generate column leakage current. Therefore the column leakage associated with the architecture 100 of the present invention during cell programming is limited to only 1 cell on the bit line instead of all the cells associated therewith (e.g., 511 cells) as in the prior art.

Figure 4:
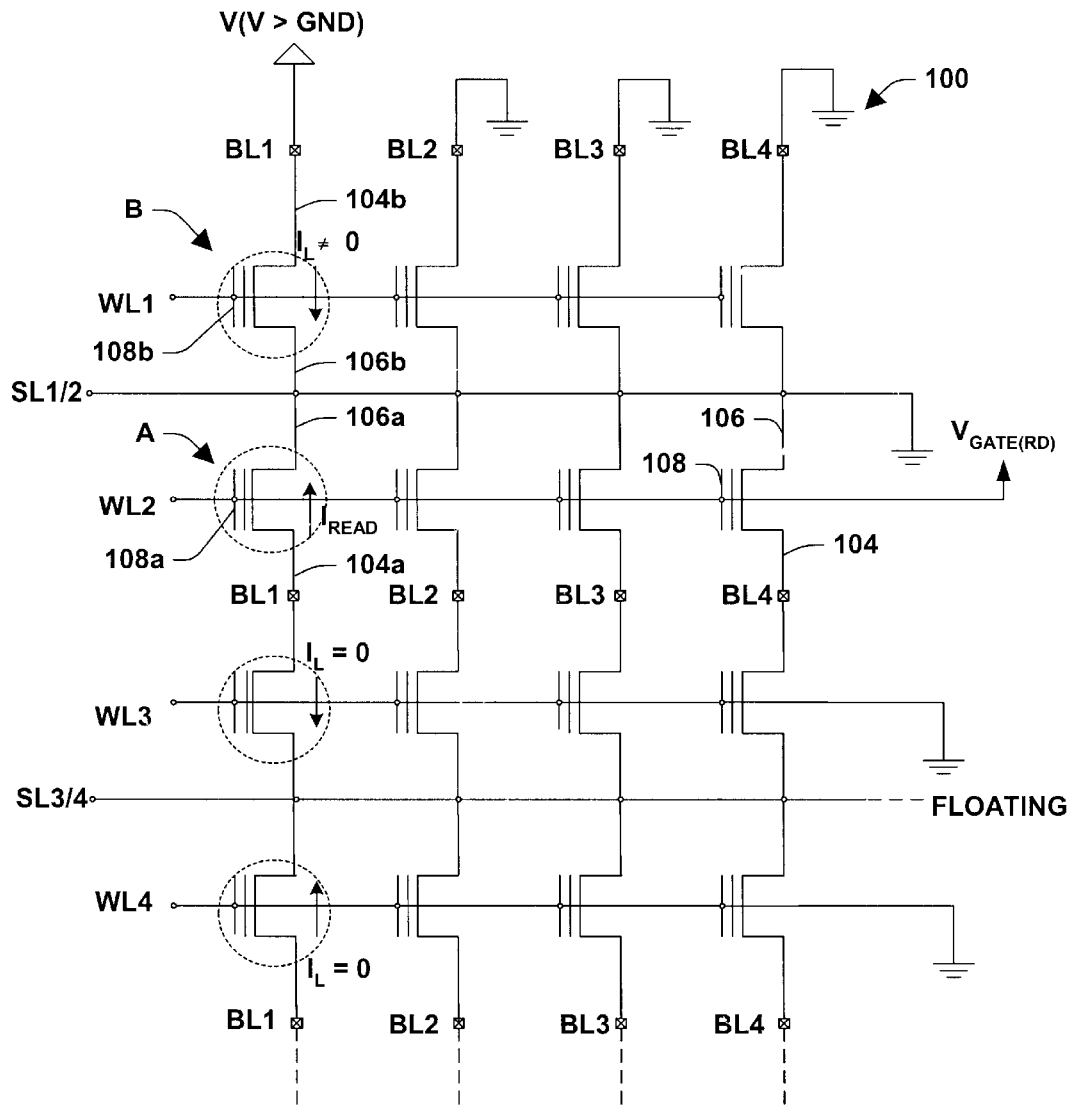
FIG. 4 is a schematic diagram illustrating a read operation with the NOR-type flash memory circuit architecture of FIG. 2 in accordance with one aspect of the present invention.

The beneficial performance of the NOR architecture 100 of the present invention is also achieved during a read operation, as illustrated in FIG. 4. When performing a read of cell A, a read voltage ($V_{GATE(RD)}$) which is higher than a threshold voltage of an unprogrammed cell and lower than a threshold voltage of a programmed cell is applied to the control gate 108a (WL2), and all the other word lines are grounded. In addition, the individually selectable source line associated with cell A (SL1/2) is connected to ground while the other individually selectable source lines are allowed to float. Lastly, a voltage having a value which is a predetermined amount greater than the source voltage (which in this case the source is grounded) is applied to the bit line (BL1) so as to apply the voltage to the drain 104a of cell A, while the other bit lines are floating. In this case, if cell A has been programmed the threshold voltage of cell A is greater than the control gate voltage ($V_{GATE(RD)}$, WL2), and no conduction occurs through cell A. In addition, cell B may experience some leakage due to it being coupled in parallel with cell A. Therefore any detected current will be due to the leakage current associated with cell B. Since this leakage current is still substantially less than the amount of current expected in an erased cell, an accurate determination of whether cell A has been programmed can be easily made, thus greatly improving the read reliability of the flash memory.

As discussed above, the architecture 100 of the present invention improves the power management of the flash memory device by reducing the amount of column leakage current during the programming and reading of a cell. In addition, the reduction in column leakage improves the readability of the cell. The improvement in readability allows the current detect circuitry used to determine whether or not a given cell is programmed to be greatly simplified. For example, since the architecture 100 of the present invention provides for a reduction in column leakage current of about three (3) order of magnitude (about 1000× or so), the sensitivity of the current detect circuitry need not be as sophisticated as in the prior art. In addition, since column leakage current is a function of temperature (increasing as the die temperature increases), the substantial reduction in column leakage current allows for a substantial simplification in the temperature compensation circuitry or, in some cases, may allow for the elimination of such circuitry altogether.

According to another aspect of the present invention, a method of programming a flash memory cell is illustrated in FIG. 5, and designated at reference numeral 200. Initially, the method 200 begins at step 202 in which the flash memory cell to be programmed is identified. The source line associated with the identified flash cell is then electrically isolated from the source lines of one or more other flash cells within the same bit line as the identified flash cell at step 204. According to one embodiment of the present invention, two flash cells are coupled in parallel between the bit line and an individually selectable source line.

The isolated source line is then coupled to a first voltage potential at step 206. For example, the isolated source line is coupled to circuit ground while the other source lines are allowed to float. The bit line associated with the identified cell is then coupled to a second voltage potential at step 208, for example, to a voltage which is a predetermined amount greater than the first voltage. A programming voltage is then coupled to the word line associated with the identified cell. Further, because only the individually selectable source line associated with the identified flash cell is coupled to ground, any leakage associated therewith is due solely to those cells similarly coupled to that source line. Consequently, by limiting a number of cells associated with a given source line and having the source lines individually selectable, the leakage current may be reduced substantially, thereby reducing power dissipation.

According to another aspect of the present invention, a method of reading a flash memory cell is disclosed in FIG. 6, and designated at reference numeral 250. Initially, method 250 begins at step 252 by identifying the flash memory cell to be read. A source line associated with the identified flash cell is then electrically isolated from the other source lines associated with the flash array at step 254. The isolated source line is then coupled to a first potential at step 256, for example, the source line associated with the identified flash cell may be coupled to circuit ground. The other source lines associated with the array may be allowed to float. The bit line associated with the identified cell is then coupled to a second voltage potential at step 258, for example, which is a predetermined amount greater than the first potential.

The method 250 continues at step 260, wherein a read voltage is coupled to the word line associated with the identified cell. The current associated with the identified cell is then sensed at step 262. If the cell had been previously programmed (e.g., a "0"), only a leakage current from the parallel bits coupled to the same source line will flow, and if the cell had not been programmed (e.g., a "1"), a substantial current would be detected.

Because the source line associated with the identified cell is isolated from the other source lines (for example, it is individually selectable) only those flash cells coupled to that particular isolated source line will contribute to any leakage current. For example, if two flash cells are coupled in parallel between the bit line and the isolated source line (and yet be connected to different word lines), any leakage current sensed during a read operation will be due only to the one cell coupled in parallel to the identified flash cell. Consequently, column leakage current ay be greatly reduced. For example, if the identified cell is programmed, the total current sensed will be leakage current associated with only two cells as opposed to all the cells of that bit line, consequently the current sense circuitry can easily determine that the cell has been programmed.

Figure 7:
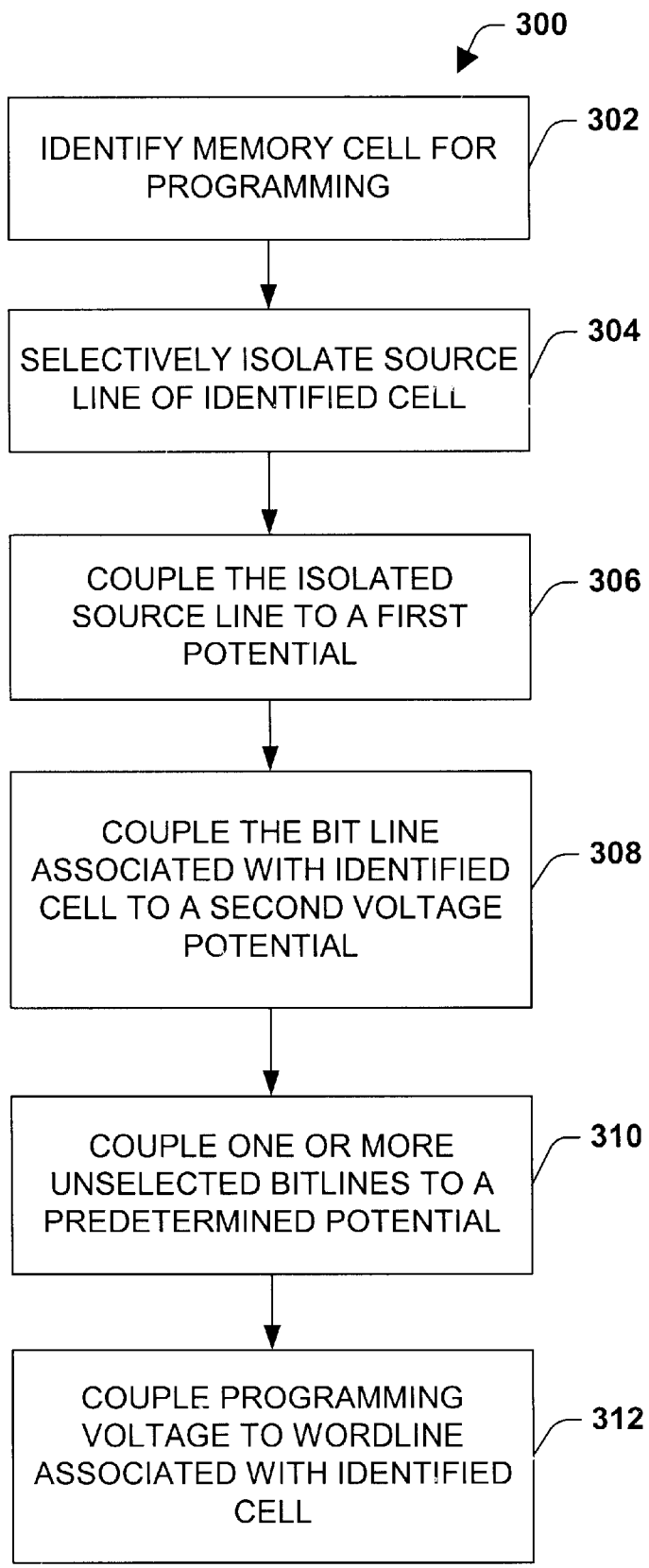
FIG. 7 is a flow chart diagram illustrating a method of programming a cell in a NOR-type flash memory circuit architecture in accordance with one aspect of the present invention.

In accordance with another aspect of the present invention, a method of programming a NOR-type flash array is illustrated in the flow chart of FIG. 7, and designated at reference numeral 300. Although the method 300 will be described in conjunction with the NOR-type architecture described above in FIG. 3, the present invention is equally applicable to other NOR-type flash circuit architectures, and such alternatives are contemplated as falling within the scope of the present invention.

The method 300 begins at step 302 in which the flash memory cell to be programmed is identified. The source line associated with the identified flash cell is then electrically isolated from the source lines of one or more other flash cells within the same bit line as the identified flash cell at step 304. According to one embodiment of the present invention, two flash cells are coupled in parallel between the bit line and an individually selectable source line. Of course, in other type NOR-type architectures, step 304 may be eliminated, as may be desired.

The isolated source line of the present example is then coupled to a first voltage potential at step 306. For example, the isolated source line is coupled to circuit ground while the other source lines are allowed to float. The bit line associated with the identified cell is then coupled to a second voltage potential at step 308, for example, to a voltage which is a predetermined amount greater than the first voltage (see, e.g., BL1 of FIG. 3). The remaining non-selected bit lines are then coupled to another voltage potential which is less than the selected bit line potential (e.g., BL2, BL3 and BL4 coupled to circuit ground potential as illustrated in FIG. 3) at step 310. Although circuit ground is used in the present example, the present invention contemplates using any potential which is less than the selected bit line potential.

Coupling the non-selected bit lines to a potential which is less than the selected bit line potential as in step 310 differs from prior art programming methodologies which allow non-selected bit lines to float. For example, when the non-selected bit lines are coupled to circuit ground potential, the source resistance of the selected cell is reduced substantially. The reduction in source resistance is due to the existence of additional current paths to ground provided by cells which exist along the same word line as the selected cell. That is, if cell A of FIG. 3 is the selected cell for programming, since BL2, BL3 and BL4 (the non-selected bit lines) are each grounded, current in cell A during programming can travel to ground along SL1/2 and across any cell sharing SL1/2 along WL2 (e.g., cell C and/or other cells along WL2). Therefore the source resistance of cell A is lowered, which means that the source 106a of cell A is closer to true circuit ground potential. Consequently, during programming of the selected cell, the drain-to-source voltage drop thereacross (e.g., $V_{DS}$ of cell A) is greater than in prior art methodologies, which results in a faster programming speed for a cell. As is well appreciated, improving the rate at which cells may be programmed is highly advantageous.

The method 300 then continues at step 312, wherein a programming voltage is then coupled to the word line associated with the identified cell. Further, because of the exemplary NOR-type flash architecture of FIG. 3, because only the individually selectable source line associated with the identified flash cell is coupled to ground, any leakage associated therewith is due solely to those cells similarly coupled to that source line. Consequently, by limiting a number of cells associated with a given source line and having the source lines individually selectable, the leakage current may be reduced substantially, thereby reducing power dissipation.

In the above exemplary method 300, all of the non-selected bit lines were coupled to a voltage potential which is less than the selected bit line voltage. Alternatively, however, the present invention may be employed in instances where only one or multiple non-selected bit lines are so coupled, while the remaining non-selected bit lines are allowed to float. In such an instance, although the source resistance of the selected cell would not be as low as possible (if all non-selected bit lines were prohibited from floating), the selected cell source resistance would still be lower than the prior art, thus providing for a faster programming speed.

Figure 8:
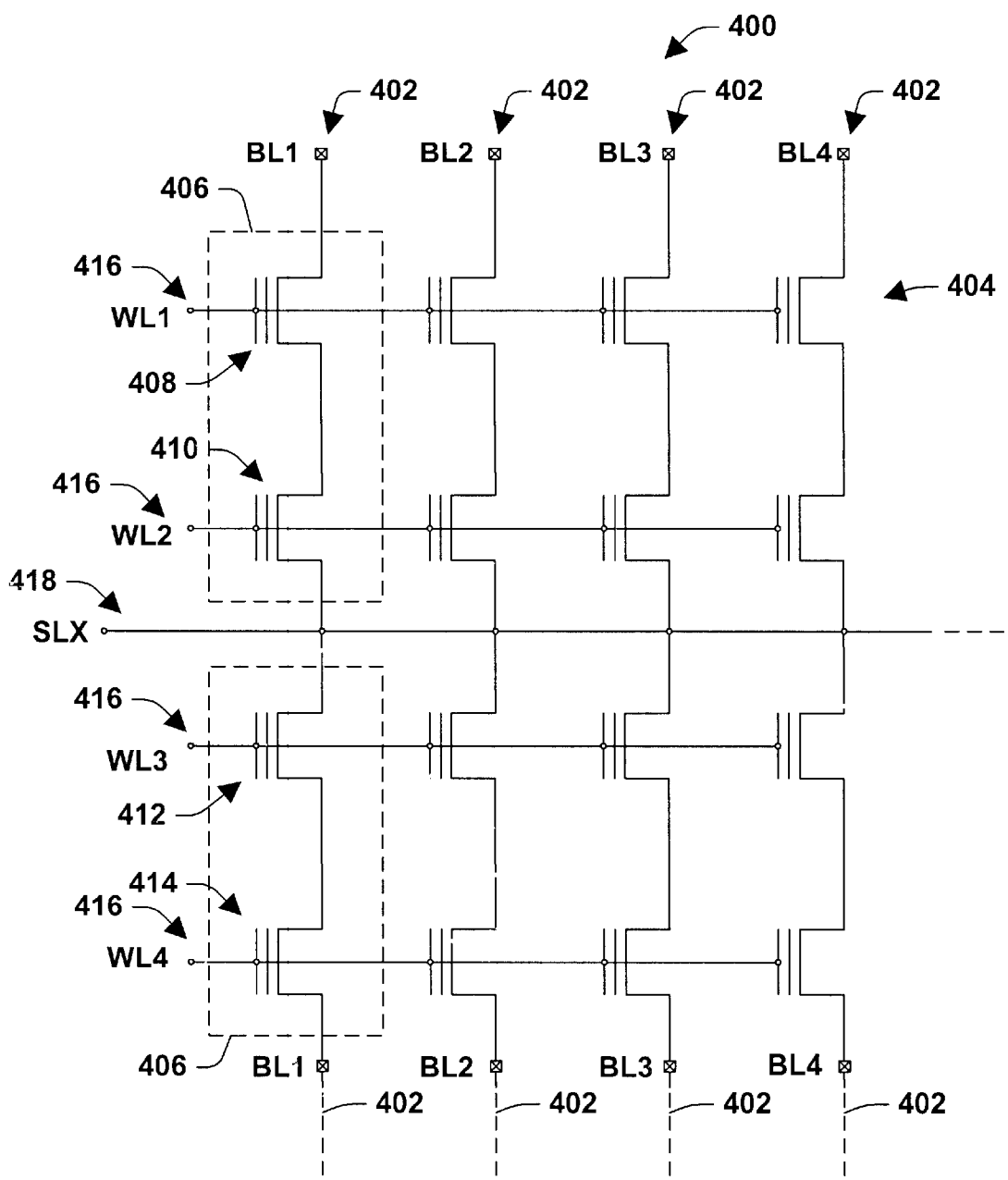
FIG. 8 is a schematic diagram illustrating a flash memory circuit architecture in accordance with another aspect of the present invention.

Another aspect of the present invention is illustrated in FIG. 8. In FIG. 8, another flash memory cell array architecture 400 is illustrated. In the architecture 400, a plurality of bit lines 402 (e.g., BL1, BL2, BL3 and BL4) are provided, wherein each of the bit lines have a plurality of flash memory cells 404 associated therewith (e.g., about 512 cells per bit line). Each of the plurality of flash memory cells 404 along a given bit line 402 are configured as sets 406 of two series-connected cells (e.g., cells 408, 410 and 412, 414). The architecture 400 further includes a plurality of word lines 416 (e.g., WL1, WL2, WL3, and WL4), wherein each of the flash memory cells associated with a given bit line are uniquely associated with their own word line, as illustrated in FIG. 8. It should be understood that although two series-connected cells are illustrated as a set in FIG. 8, that more than two cells could be connected together in series to form a set and such an alternative is contemplated as falling within the scope of the present invention.

Referring still to FIG. 8, the two sets 406 of series-connected flash memory cells are coupled together in parallel between their bit line 402 (e.g., BL1) and an individually selectable source line 418 (e.g., SLX). As one traverses a given bit line (which may contain 512 flash memory cells, for example), each successive two sets of series-connected flash memory cells may be similarly coupled together in parallel between the bit line 402 and their own respective individually selectable source line 418. For example, referring to FIG. 9, the two sets 406 are coupled in parallel between BL1 and SLX, however, another set 420 will be in parallel with another set therebelow (not shown) between BL1 and another individually selectable source line 422 (e.g., SLX+1), wherein the source lines 418 and 422 may be selected separately from one another and isolated from one another, respectively.

Figure 9:
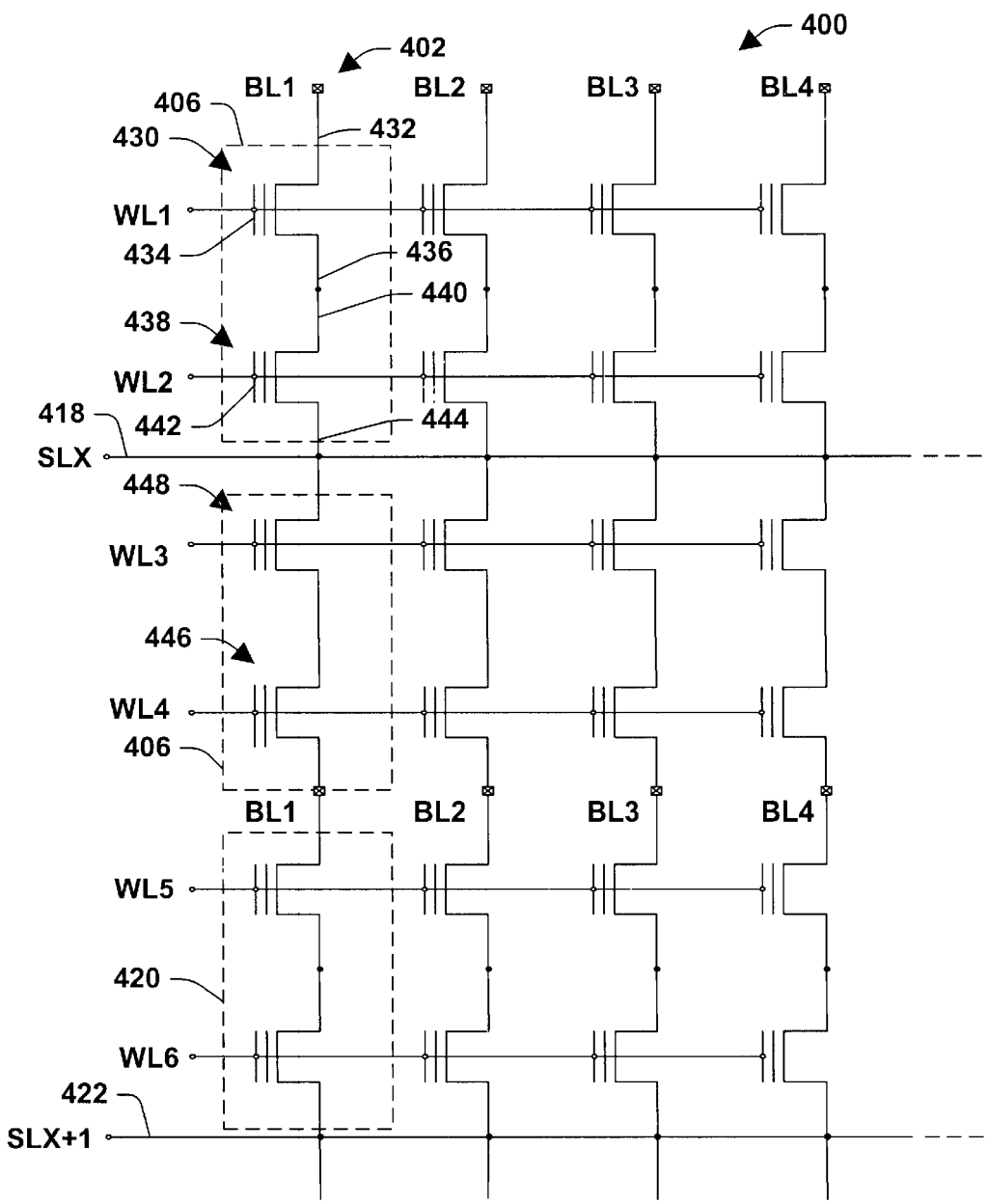
FIG. 9 is a schematic diagram illustrating various features of the flash memory circuit architecture of FIG. 8 in accordance with an aspect of the present invention.

In addition, although the sets 406 are said to be connected in parallel between the associated bit line and their respective individually selectable source line, each of the flash memory cells in each of the sets on a given bit line are coupled to their own respective word line, as illustrated in FIG. 9. Still referring to FIG. 9, each set 406 of two series-connected flash memory cells contains a first flash memory cell (e.g., cell 430) having a drain terminal 432 coupled to the respective bit line 402 (e.g., WL1), and a source terminal 436. The set 406 further contains a second flash memory cell (e.g., cell 438) having a drain terminal 440 coupled to the source terminal 436 of the first flash memory cell 430, and a gate terminal 442 coupled to another one of the word lines 416 (e.g., WL2). Lastly, the flash cell 438 has a source terminal 444 coupled to an individually selectable source line 418 (e.g., SLX). The "parallel" set corresponding to the above set has flash cells 446 and 448 coupled together in a similar manner with cell 446 corresponding to cell 430 and cell 448 corresponding to cell 438, respectively.

Figure 10:
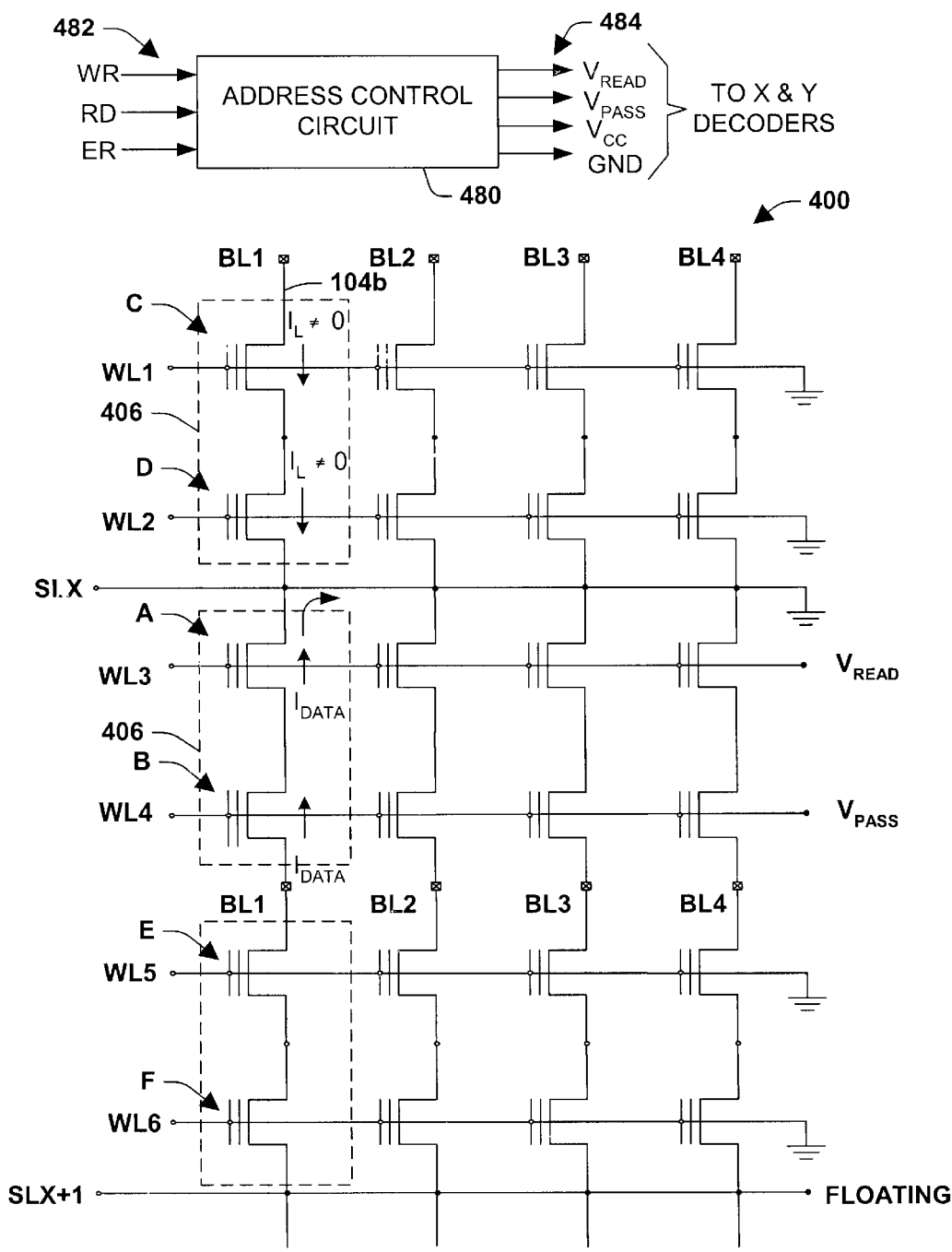
FIG. 10 is a schematic system diagram illustrating various features of the flash memory circuit architecture of FIG. 8 during a read operation in accordance with an aspect of the present invention.
Figure 11:
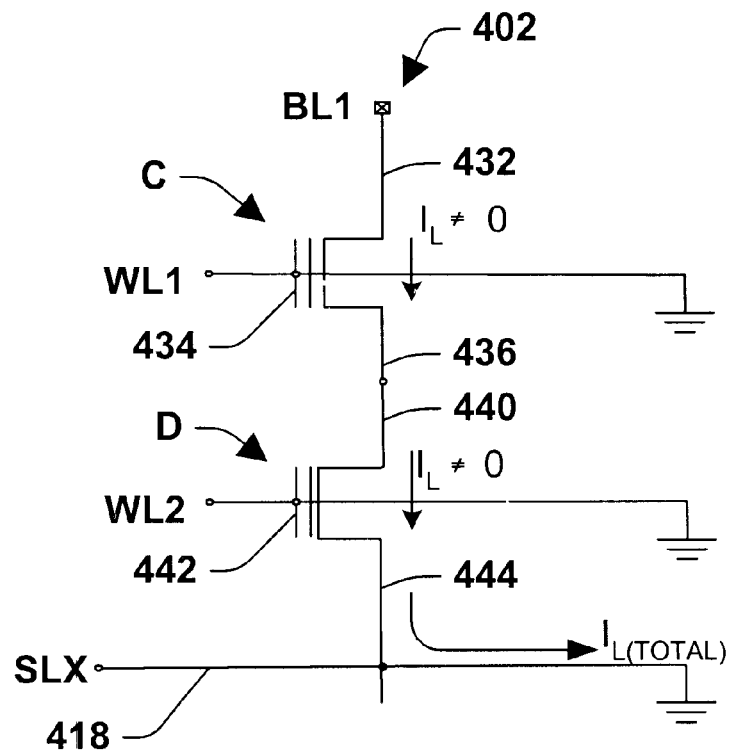
FIG. 11 is a schematic diagram illustrating how the series connection of flash memory cells a set coupled in parallel with the identified flash cell act to further reduce column leakage in accordance with an aspect of the present invention.

The array architecture 400 of FIGS. 8 and 9 operates as follows, and such operation will be discussed in conjunction with FIGS. 10 and 11. FIG. 10 illustrates the array architecture 400 along with an address control circuit 480 which is operable to receive one or more control signals 482 indicating, for example, a read, write or erase operation (or other type operations such as verify, soft program, etc., as may be desired), and generate or pass a plurality of voltages 484 to x and Y decoder circuitry (not shown, however, such decoder circuitry may be integrated within the address control circuit 480, as may be appreciated) based thereon. For example, in a read mode operation, the control signal(s) 482 indicate to the address control circuit 480 that a read operation is to take place, and the address control circuit activates various internal circuitry associated therewith to generate or pass the necessary voltages necessary to perform the read operation to the X and Y decoder circuitry for selective application of such voltages to the array 400.

According to one exemplary aspect of the present invention, in a read mode, the address control circuit 480 generates or passes a read voltage ($V_{READ}$), which is a voltage having a value which is less than a threshold voltage of a programmed cell and greater than a threshold voltage of an unprogrammed cell. In addition, the circuit 480 generates or passes a pass voltage ($V_{PASS}$) which is a voltage large enough to activate a cell to substantial conduction (as will be discussed in greater detail infra), a bit line voltage such as $V_{CC}$ and a source line voltage such as a circuit ground potential (GND).

When reading a particular cell such as cell A according to the present invention, a read voltage $V_{READ}$ is generated and placed on the word line 416 associated with cell A (WL3). In addition, a pass voltage ($V_{PASS}$) is generated and placed on word line 416 associated with cell B (WL4), wherein cell B is the series-connected transistor associated with cell A, which together form a set 406. The pass voltage $V_{PASS}$ is sufficiently high to ensure that the current associated with cell A ($I_{DATA}$) can flow relatively unimpeded. For example, $V_{PASS}$ may be a voltage value greater than the threshold voltage of an unprogrammed cell.

Since cells A and B are in series, the current $I_{DATA}$ dictated by the state of cell A will flow in the direction illustrated to the grounded source line 418 associated with cell A. In addition, during such a read, the other two series-connected flash memory cells (cells C and D) which together as a set are in parallel with cells A and B between the bit line BL1 and the selectable source line SLX, have their word lines (WL1 and WL2) coupled to a circuit ground potential to ensure that the cells C and D are turned off.

As discussed above, although cells C and D are turned off, since they are coupled in parallel with cells A and B, their bit line is high and their source line is low, thus some leakage may exist therein. However, the leakage is only associated with cells C and D since the remaining cells (e.g., cells E and F) associated with the given bit line (BL1) do not contribute to any leakage since each of the remaining individually selectable source lines (e.g., SLX+1, etc.) are floating or are connected to a high impedance state.

Not only is the leakage reduced due to the other flash cells in the bit line not contributing due to their individually selectable source lines floating, but the series-connected arrangement of cells C and D further acts to reduce the leakage associated therewith. As illustrated in FIG. 11, for example, cells C and D are biased off by grounding their respective word lines WL1 and WL2. Since cells C and D are in series with one another, the total leakage associated with the series-connected configuration is limited by the least leaky of the two cells. Thus, for example, if cell D is extremely leaky for whatever reason ($I_{L(CELL\ D)} > I_{L(CELL\ C)}$), the total leakage would be limited by the leakage associated with cell C. Thus the sets of series-connected flash memory cells further act to reduce column leakage and thus serve to reduce power consumption and improve cell read accuracy.

In addition to the advantages highlighted above, since the two memory cells within a set are coupled in series, no self-aligned source (SAS) etch is required in the fabrication process. When reading a cell, current flows between the bit line and source line contacts, thus no contacts are required to the junctions between the series-connected flash cells. Hence no SAS etch is needed to provide a horizontal conducting path. This additional advantage simplifies the process and reduces the number of process masks and manufacturing steps. In addition, since no horizontal conducting path is needed between the word lines of the series-connected cells, the implant dose into that region may be reduced which results in improved (reduced) short channel effects.

Figure 12:
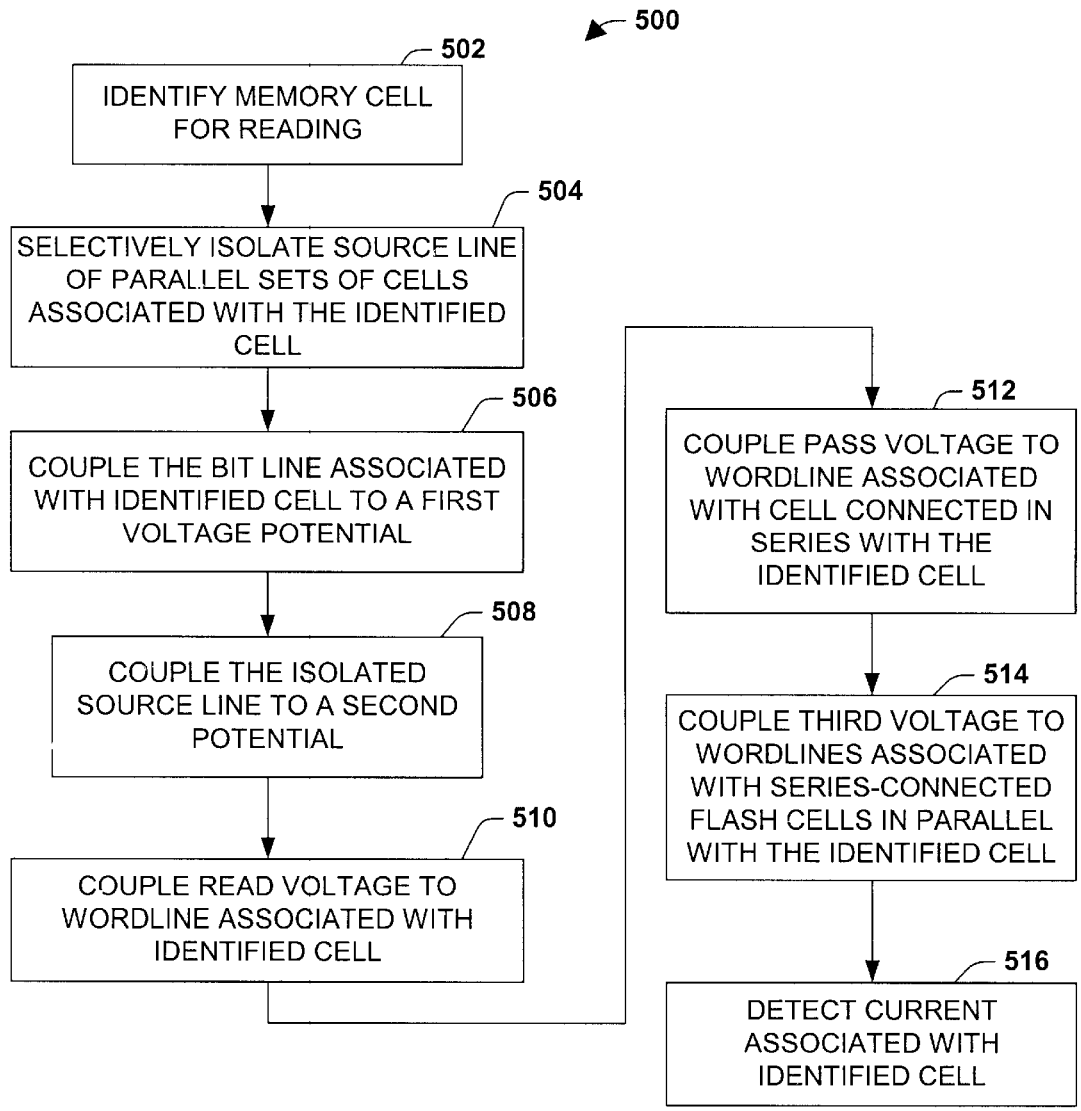
FIG. 12 is a flow chart diagram illustrating a method of reading an identified flash memory cell in the flash array architecture of FIG. 8 in accordance with another aspect of the present invention.

In accordance with another aspect of the present invention, a method of performing a read operation in conjunction with the flash memory array architecture 400 of FIGS. 8–11 is disclosed, as illustrated in FIG. 12, and designated at reference numeral 500. While the exemplary method 500 is illustrated and described herein as a 30 series of acts or events, it will be appreciated that the present invention is not limited by the illustrated ordering of such acts or events, as some acts may occur in different orders and/or concurrently with other acts apart from that shown and described herein, in accordance with the invention. In addition, not all illustrated acts or events may be required to implement a methodology in accordance with the present invention. Moreover, it will be appreciated that the method 500 may be implemented in association with the apparatus and systems illustrated and described herein as well as in association with other systems not illustrated.

Referring to FIG. 12, the method 500 is initiated by identifying a flash memory cell for reading at event 502. Typically, such a cell is identified in conjunction with an entire word or group of words to be read, however, such an identification may be accomplished as a single cell, as may be desired. Further, such an identification is typically provided, via a read request and sector address tag from a CPU or the like, however, any type of identification may be employed and such alternatives are contemplated as falling within the scope of the present invention. The method 500 continues at event 504, wherein an individually selectable source line which is associated with the identified cell is isolated from the other source lines. According to one exemplary aspect of the invention, such isolation is performed by configuring the array as illustrated in FIG. 8, wherein each of the source lines 418 are separately addressable, as opposed to prior art NOR type architectures, wherein all the cells have source terminals coupled to a common source line. Thus, by decoupling the nonselected source lines from the circuit and allowing them to float or by coupling nonselected source lines to a high impedance state, the selected source line may be isolated therefrom.

The method 500 continues at event 506, wherein the bit line associated with the identified flash memory cell is coupled to a first voltage potential. For example, if cell A of FIG. 10 is the identified cell, then BL1 will be coupled to the first voltage. The first voltage value may vary based on the type of flash cell being employed. For example, the first voltage may comprise a supply voltage value or a boosted or pump voltage that exceeds a supply voltage value, as may be desired. At step 508, the isolated source associated with the identified flash memory cell is coupled to a second voltage potential. For example, if cell A of FIG. 10 is the identified flash memory cell, then the associated source line 418 is SLX. According to one exemplary aspect of the present invention, the second voltage potential is a circuit ground potential, however, other voltage values may be employed and are contemplated as falling within the scope of the present invention. For example, typically the second voltage need be less than the bit line voltage by a predetermined amount and less than an applied word line voltage, as will be discussed in greater detail below.

The method 500 continues at event 510, wherein a read voltage is applied to a word line 416 associated with the identified flash memory cell. For example, if cell A of FIG. 10 is the identified cell, a read voltage is applied to WL3. According to one exemplary aspect of the present invention, the read voltage is a voltage value which is between the threshold voltage values of a programmed cell and an unprogrammed cell. When programmed, a flash memory cell exhibits a higher threshold voltage than an unprogrammed cell. Consequently, by making the read voltage value between such threshold voltage values, a determination regarding the state of the cell (e.g., programmed or unprogrammed) can be made by evaluating whether the cell is conducting an appreciable amount of current.

At event 512, a pass voltage is applied to a word line associated with the cell which is series-connected with the identified cell. For example, if cell A of FIG. 10 is the identified cell, then the pass voltage is applied to WL4, which is the word line associated with cell B. According to one exemplary aspect of the present invention, the pass voltage is a voltage value which exceeds the threshold voltage of a programmed cell; therefore regardless of whether cell B is programmed, cell B will be in a state to permit sufficient conduction of the current dictated by the state of the identified cell (e.g., cell A) to be subsequently detected in an accurate manner.

At event 514, a third voltage is coupled to the word lines associated with the two series-connected flash memory cells which together as a set are coupled in parallel with the set containing the identified flash cell. For example, if cell A of FIG. 10 is the identified cell to be read, the third voltage is applied to the word lines associated with cells C and D, that is, WL1 and WL2, since as a set of cells, C and D are coupled in parallel with cells A and B. According to one exemplary aspect of the present invention, the third voltage potential is a circuit ground potential which ensures that cells C and D are off. Thus the only current contribution due to cells C and D will be due solely to leakage current. Furthermore, since cells C and D are coupled together in series, the total leakage associated therewith is limited by the least leaky of cells C and D, as described above in conjunction with FIG. 11.

The method 500 then continues at event 516, wherein the current associated with the identified cell is detected. For example, the current detection may involve converting the current to a voltage and comparing the voltage to a predetermined threshold value. Alternatively, other current detection procedures, circuits or systems may be employed and such alternatives are contemplated as falling within the scope of the present invention. If the detected current is less than a predetermined value, then the state of the identified cell is determined to be programmed; conversely if the detected current exceeds a predetermined value, then the state of the identified cell is determined to be unprogrammed.

As discussed above, since all the remaining cells associated with the given bit line BL1 (that is, excluding cells A, B, C and D) are isolated from the individually selectable source line (SLX), for example, they are floating, none of the remaining cells will contribute to column leakage, thus substantially reducing power consumption of the array. Further, since the total column leakage that will exist is limited by the least leaky of cells C and D (in this example), the read accuracy of the read operation is enhanced substantially.

While the above invention has been discussed in conjunction with a stacked gate type flash memory cell, it should be understood that the present invention applies equally to other type flash memory cell structures, and such alternative structures are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A flash memory array architecture, comprising:
   a plurality of bit lines, wherein each of the bit lines comprise a plurality of memory cells associated therewith, wherein the plurality of memory cells are configured as sets of two series-connected memory cells, wherein two sets of such memory cells are coupled together in parallel between a respective bit line and an individually selectable source line; and
   a plurality of word lines, wherein each of the plurality of memory cells associated with one of the plurality of bits lines is coupled to a respective one of the plurality of word lines.

2. The flash memory array architecture of claim 1, wherein a first set of series-connected memory cells comprises:
   a first flash memory cell having a drain terminal coupled to the respective bit line, a gate terminal coupled to one of the plurality of word lines, and a source terminal; and
   a second flash memory cell having a drain terminal coupled to the source terminal of the first flash memory cell, a gate terminal coupled to a second one of the plurality of word lines, and a source terminal coupled to the individually selectable source line.

3. The flash memory array architecture of claim 2, wherein a second set of series-connected memory cells connected in parallel with the first set comprises:
   a third flash memory cell having a drain terminal coupled to the respective bit line, a gate terminal coupled to a third one of the plurality of word lines, and a source terminal; and
   a fourth flash memory cell having a drain terminal coupled to the source terminal of the third flash memory cell, a gate terminal coupled to fourth one of the plurality of word lines, and a source terminal coupled to the individually selectable source line.

4. The flash memory array architecture of claim 1, further comprising an address control circuit associated with the array of flash memory cells, wherein the address control circuit is operable to generate a plurality of voltages when a flash memory cell is to be read, and further operable to coupled a first voltage to the respective bit line associated with the flash memory cell to be read, couple a read voltage to the word line associated with the cell to be read, couple a pass voltage to the word line of the flash memory cell connected in series with the flash memory cell to be read, couple a second voltage which is less than the first voltage to the word lines of the remaining bit lines and the individually selectable source line associated with the flash memory cell to be read.

5. The flash memory array architecture of claim 4, wherein the address control circuit further couples the remaining individually selectable source lines to a high impedance state or allows the remaining individually selectable source lines to float.

6. The flash memory array architecture of claim 4, wherein the first voltage comprises a supply voltage value.

7. The flash memory array architecture of claim 6, wherein the pass voltage is substantially equal to the first voltage.

8. The flash memory array architecture of claim 4, wherein the second voltage comprises a circuit ground potential.

9. A method of reading a flash memory array, wherein the flash memory array comprises a plurality of bit lines, wherein each of the bit lines comprise a plurality of memory cells associated therewith, and wherein the plurality of memory cells are configured as sets of two series-connected memory cells, and wherein two sets of such memory cells are coupled together in parallel between a respective bit line and an individually selectable source line, and wherein the flash memory array further comprises a plurality of word lines, wherein each of the plurality of memory cells associated with one of the plurality of bits lines is coupled to a respective one of the plurality of word lines, comprising the steps of:

coupling a bit line associated with a flash memory cell to be read to a first voltage;

coupling the individually selectable source line associated with the flash memory cell to be read to a second voltage, wherein the second voltage is less than the first voltage;

coupling a word line associated with the flash memory cell to be read to a read voltage;

coupling a word line associated with the flash memory cell which is coupled in series with the flash memory cell to be read to a pass voltage;

coupling word lines associated with a set of series-connected flash memory cells which are coupled in parallel with a set of series-connected flash memory cells containing the flash memory cell to be read to a third voltage, wherein the third voltage is less than the first voltage; and detecting a current associated with the flash memory cell to be read, wherein the current is indicative of a data value associated therewith.

10. The method of claim 9, wherein the first voltage comprises a voltage value which is approximately equal to a voltage supply value.

11. The method of claim 9, wherein the second voltage comprises a voltage value which is approximately equal to a circuit ground potential.

12. The method of claim 9, wherein the second voltage and the third voltage are approximately the same voltage value.

13. The method of claim 12, wherein the second voltage and third voltage comprise a voltage value which is approximately equal to a circuit ground potential.

14. The method of claim 9, wherein the read voltage comprises a voltage value which is greater than a threshold voltage value of an unprogrammed flash memory cell, and is less than a threshold voltage value of a programmed flash memory cell.

15. The method of claim 9, wherein the pass voltage comprises a voltage value which is approximately equal to a supply voltage value.

16. The method of claim 9, wherein detecting the current comprises:

coupling the flash memory cell to be read to a sense amplifier;

comparing the detected current to a target value; and determining whether the flash memory cell to be read is programmed or unprogrammed based on the comparison.

17. The method of claim 16, wherein comparing the detected current to a target value comprises converting the detected current to a voltage and comparing the voltage to a predetermined voltage value.

18. The method of claim 9, further comprising coupling the remaining word lines to the second voltage.

19. The method of claim 9, further comprising coupling the bit lines which are not associated with the flash memory cell to be read to the second voltage.

20. The method of claim 9, further comprising coupling any individually selectable source lines not associated with the flash memory cell to be read to a high impedance state or allowing the such individually selectable source lines to float.

* * * * *

UNITED STATES PATENT AND TRADEMARK OFFICE
CERTIFICATE OF CORRECTION

PATENT NO. : 6,449,188 B1
DATED : September 10, 2002
INVENTOR(S) : Richard Fastow It is certified that error appears in the above-identified patent and that said Letters Patent is hereby corrected as shown below:

Column 7,
Line 20, please add the word -- in -- after the word "cells".

Column 12,
Line 67, please delete the phrase "toxand" and replace it with -- to X and --.

Column 14,
Line 18, please delete the numeral "30" before the word "series".

Signed and Sealed this

Seventh Day of January, 2003

JAMES E. ROGAN
*Director of the United States Patent and Trademark Office*